US012283344B1

(12) United States Patent
Choi et al.

(10) Patent No.: US 12,283,344 B1
(45) Date of Patent: Apr. 22, 2025

(54) ELECTRONIC DEVICE WITH BUFFERED OPERATION ENGINE AND METHOD FOR PERFORMING CALCULATION USING SAME

(71) Applicant: XCENA Inc., Seongnam-si (KR)

(72) Inventors: Ji Hun Choi, Yongin-si (KR); Do hun Kim, Yongin-si (KR)

(73) Assignee: XCENA Inc., Seongnam-si (KR)

( * ) Notice: Subject to any disclaimer, the term of this patent is extended or adjusted under 35 U.S.C. 154(b) by 0 days.

(21) Appl. No.: 18/823,046

(22) Filed: Sep. 3, 2024

(30) Foreign Application Priority Data

Jul. 5, 2023 (KR) .......................... 10-2023-0086989

(51) Int. Cl.
*G11C 11/419* (2006.01)
*G11C 7/10* (2006.01)

(52) U.S. Cl.
CPC .......... *G11C 7/1084* (2013.01); *G11C 11/419* (2013.01)

(58) Field of Classification Search
CPC ............................. G11C 11/419; G11C 7/1084
USPC ...................................................... 365/189.05
See application file for complete search history.

(56) References Cited

U.S. PATENT DOCUMENTS

| 2018/0164394 A1* | 6/2018 | Li ........................ G06T 11/006 |
| 2019/0197019 A1* | 6/2019 | Patil ....................... G06F 17/11 |
| 2022/0301600 A1* | 9/2022 | Kwon .................... G11C 16/30 |

FOREIGN PATENT DOCUMENTS

| KR | 10-2019-0015368 A | 2/2019 |
| WO | 2017/214320 A1 | 12/2017 |

OTHER PUBLICATIONS

"Request for the Submission of an Opinion" Office Action issued in KR 10-2023-0086989; mailed by the Korean Intellectual Property Office on Dec. 20, 2023.
"Written Decision on Registration" Office Action issued in KR 10-2023-0086989; mailed by the Korean Intellectual Property Office on Apr. 5, 2024.

* cited by examiner

*Primary Examiner* — Sung Il Cho
(74) *Attorney, Agent, or Firm* — Studebaker Brackett PLLC (57) ABSTRACT

As one aspect of the present disclosure, an electronic device is disclosed. The electronic device comprises a receiving unit for receiving a command from an external source, a first buffer for storing a first data value, and an operation engine for loading the first data value from the first buffer in response to the command and performing an operation based on a predetermined calculation formula on the loaded first data value, wherein the first data value is at least one of a result data value obtained by the operation engine previously performing an operation based on the predetermined calculation formula or a query data value to be used for an operation based on the predetermined calculation formula.

7 Claims, 9 Drawing Sheets

| t1 | t2 | t3 | t4 | ... |
|---|---|---|---|---|
| RE1 | RE2 | RE3 | ... | |
| | RD1 | RD2 | RD3 | ... |
| | CAL1 | CAL2 | CAL3 | ... |
| | WE1 | WE2 | WE3 | ... |

ELECTRONIC DEVICE WITH BUFFERED OPERATION ENGINE AND METHOD FOR PERFORMING CALCULATION USING SAME

CROSS-REFERENCE TO RELATED APPLICATION

This application claims priority to Korean Patent Application No. 10-2023-0086989, filed in the Korean Intellectual Property Office on Jul. 5, 2023, the entire contents of which are hereby incorporated by reference.

BACKGROUND

Field

The present disclosure relates to an electronic device that performs repetitive operations and input/output on its own without relying on cores and a method for performing operations using the device.

Description of Related Art

A method of reducing redundant operations by utilizing results that have been calculated and stored in advance when the same operations must be performed repeatedly is called memoization. Memoization is utilized in various fields, and a representative example is dynamic programming. Dynamic programming involves breaking down a complex problem into several simpler sub-problems, solving them, and combining the solutions to solve the original problem. At this time, the solutions to the sub-problems are stored, and when the same sub-problem appears, the solutions obtained in advance are utilized.

Dynamic programming algorithms such as the Smith-Waterman algorithm and the Needleman-Wunsch algorithm are utilized for operations such as DNA sequence alignment, protein classification, and protein folding. These dynamic programming algorithms can measure the genetic sequence fitness of differently aligned samples through a scoring method. For example, the Smith-Waterman algorithm has very high accuracy in results, but it requires more computing resources and time than other algorithms. In other words, if operations are performed using the Smith-Waterman algorithm, the previously calculated result values need to be loaded when calculating each data and stored again after calculation. Thus, there is a problem that a significant workload is imposed on the core, such as the CPU, which must process inputs/outputs and operations of a large amount of data. Accordingly, there is a need for a means that can reduce such workload instead of the cores performing repetitive operations and inputs/outputs required for dynamic programming algorithms.

SUMMARY

An object of the present disclosure is to provide an electronic device and an operation method using the same that can reduce the workload for data inputs/outputs and operations that the cores had to perform in the past.

However, the issues that the present disclosure aims to address are not limited to those mentioned above, and may encompass objects that have not been explicitly stated but can be clearly understood by a person with ordinary knowledge in the technical field to which the present disclosure belongs from the description below.

The present disclosure can be implemented in various ways, including a device, a system, a method, or a computer program stored in a readable storage medium.

An electronic device according to an embodiment of the present disclosure includes: a receiving unit for receiving a command from an external source; a first buffer for storing a first data value; and an operation engine for loading the first data value from the first buffer in response to the command and performing an operation based on a predetermined calculation formula on the loaded first data value, wherein the first data value is at least one of a result data value obtained by the operation engine previously performing an operation based on the predetermined calculation formula or a query data value to be used for an operation based on the predetermined calculation formula.

In the electronic device described above, the electronic device further includes a second buffer for receiving a second data value from an external memory device outside the electronic device.

In the electronic device described above, the first buffer and the second buffer are SRAMs.

In the electronic device described above, the loading of the first data value from the first buffer in response to the command is performed a first time cycle before performing the operation using the first data value, and the first time cycle is equal to or longer than a delay time required to load data from the first buffer.

In the electronic device described above, the operation engine stores the first result data value generated as a result of performing the operation on the first data value in the first buffer.

In the electronic device described above, the operation engine transmits a part of the result data value generated as a result of performing the operation on the first data value to an external memory device.

In the electronic device described above, the electronic device further includes a transmitting unit, and the transmitting unit includes a third buffer for receiving a part of the result data value from the operation engine, temporarily storing the same, and sequentially transmitting the same to the external memory device.

In the electronic device described above, the predetermined calculation formula is a calculation formula based on the Smith-Waterman algorithm.

The electronic device described above transmits a request for a data value to be received by the second buffer to the external memory device.

In the electronic device described above, the operation engine further includes a buffer management module, and the buffer management module determines the optimized size and number of first data values to be loaded into the first buffer.

A method for performing an operation using an electronic device according to an embodiment of the present disclosure includes: receiving a command from an external source of the electronic device; loading a first data value from a first buffer within the electronic device; and performing an operation based on a predetermined calculation formula on the loaded first data value to generate a result data value, the first data value being at lease one of a result data value obtained by previously performing an operation based on the same predetermined calculation formula or a query data value to be used for an operation based on the predetermined calculation formula.

The above-described method further includes loading a second data value received from an external memory device outside the electronic device from a second buffer, wherein the operation based on the predetermined calculation formula is performed on the first data value and the second data value.

In the above-described method, the first buffer and the second buffer are SRAMs.

In the above-described method, the loading of the first data value from the first buffer in response to the command is performed a first time cycle before performing the operation using the first data, and the first time cycle is equal to or longer than a delay time required to load data from the first buffer.

The above-described method further includes storing a first result data value generated as a result of performing the operation on the first data value in the first buffer.

The above-described method further includes transmitting a part of the result data value generated as a result of performing the operation on the first data value to an external memory device.

The above-described method further includes transmitting a request for a data value to be received by the second buffer to the external memory device.

The above-described method further includes determining the optimized size and number of first data values to be loaded into the first buffer.

According to the present disclosure, the following effects are achieved.

According to various embodiments of the present disclosure, since data required for operation is loaded and used through one or more buffers provided in the electronic device, the workload for data inputs/outputs and operations that the core had to perform in the past can be alleviated.

According to various embodiments of the present disclosure, since the operation pipeline of the electronic device is constructed to pre-load data values by considering the delay time required when loading data values required for operation from the buffer, the effect of minimizing the impact due to the delay in loading data values can be obtained.

The effects of the present disclosure are not limited to the effects described above, and other effects not described herein can be clearly understood by those of ordinary skill in the art to which this disclosure belongs (hereinafter referred to as "ordinary technician") from the description of the claims.

BRIEF DESCRIPTION OF THE DRAWINGS

The following drawings attached to this specification illustrate preferred embodiments of the present disclosure, and serve to further understand technical ideas of the present disclosure together with the detailed description of the present disclosure. Thus, the present disclosure should not be construed as being limited to the drawings.

DETAILED DESCRIPTION

Various embodiments set forth herein are illustrated for the purpose of clearly describing the technical idea of the present disclosure, and are not intended to be limited to specific embodiments. The technical idea of the present disclosure includes various modifications, equivalents, and alternatives of each embodiment set forth herein, and embodiments selectively combined from all or parts of each embodiment. In addition, the scope of the technical idea of the present disclosure is not limited to various embodiments or specific descriptions thereof presented below.

Terms used herein, including technical or scientific terms, may have meanings that are generally understood by a person having ordinary knowledge in the art to which the present disclosure pertains, unless otherwise defined.

Expressions such as "include," "may include," "provided with," "may be provided with," "have," "may have," and the like used herein mean that target features (for example, functions, operations, components, and the like) exist, and do not exclude the presence of other additional features. In other words, such expressions should be understood as open-ended terms connoting the possibility of including other embodiments.

Singular expressions used herein may include plural expressions as well, unless the context clearly indicates the singular expressions. Further, the plural forms are intended to include the singular forms as well, unless the context clearly indicates the plural forms. Further, throughout the description, when a portion is stated as "comprising (including)" a component, it is intended as meaning that the portion may additionally comprise (or include or have) another component, rather than excluding the same, unless specified to the contrary.

Further, the term "module" or "part" used herein refers to a software or hardware component, and "module" or "part" performs certain roles. However, the meaning of the "module" or "part" is not limited to software or hardware. The "module" or "part" may be configured to be in an addressable storage medium or configured to play one or more processors. Accordingly, as an example, the "module" or "part" may include at least one of components such as software components, object-oriented software components, class components, and task components, and processes, functions, attributes, procedures, subroutines, program code segments, drivers, firmware, micro-codes, circuits, data, database, data structures, tables, arrays, and variables. Furthermore, functions provided in the components and the "modules" or "parts" may be combined into a smaller number of components and "modules" or "parts," or further divided into additional components and "modules" or "parts."

According to one embodiment of the present disclosure, the "module" or "part" may be implemented as a processor and a memory. The "processor" should be interpreted broadly to encompass a general-purpose processor, a central processing unit (CPU), a microprocessor, a digital signal processor (DSP), a controller, a microcontroller, a state machine, and so forth. Under some circumstances, the "processor" may refer to an application-specific integrated circuit (ASIC), a programmable logic device (PLD), a field-programmable gate array (FPGA), and so on. The "processor" may refer to a combination of processing devices, for example, a combination of a DSP and a microprocessor, a combination of a plurality of microprocessors, a combination of one or more microprocessors in conjunction with a DSP core, or any other combination of such configurations. In addition, the "memory" should be interpreted broadly to encompass any electronic component that is capable of storing electronic information. The "memory" may refer to various types of processor-readable media such as random-access memory (RAM), read-only memory (ROM), non-volatile random-access memory (NVRAM), programmable read-only memory (PROM), erasable programmable read-only memory (EPROM), electrically erasable PROM (EEPROM), flash memory, magnetic or optical data storage, registers, and the like. The memory is said to be in electronic communication with a processor if the processor may read information from and/or write information to the memory. The memory integrated into the processor is in electronic communication with the processor.

Expressions such as "first," "second," and the like, used herein are used to distinguish one object from another when referring to a plurality of objects of the same kind, unless the context indicates otherwise, and are not intended to limit the order or importance among the corresponding objects.

Expressions such as "A, B, and C," "A, B, or C," "A, B, and/or C," or "at least one of A, B, and C," "at least one of A, B, or C," "at least one of A, B, and/or C," "at least one selected from A, B, and C," "at least one selected from A, B, or C," "at least one selected from A, B, and/or C," and the like, used herein may refer to each listed item or all possible combinations of listed items. For example, "at least one selected from A and B" may refer to all of (1) A, (2) at least one among As, (3) B, (4) at least one among Bs, (5) at least one among As and at least one among Bs, (6) at least one among As and B, (7) at least one among Bs and A, and (8) A and B.

The expression "based on" or "according to" used herein is used to describe one or more factors that affect an action or operation of decision or determination described in a phrase or sentence including the corresponding expression, and this expression does not exclude additional factors that affect the action or operation of the corresponding decision or determination.

As used herein, the expression that a certain component (for example, a first component) is "connected to" or "coupled with" another component (for example, a second component) may mean that the certain component may not only be directly connected to or coupled with the another component, but also be connected to or coupled with the another component through yet another component (for example, a third component).

The expression "configured to" used herein may have the meaning of "being set to," "having the ability to," "being modified to," "being made to," "being capable of," and the like, depending on the context. The expression is not limited to the meaning of "designed specifically in hardware" and, for example, a processor configured to perform a specific operation may refer to a generic-purpose processor capable of performing the specific operation by executing software.

Hereinafter, various embodiments of the present disclosure will be described with reference to the accompanying drawings. In the accompanying drawings and description of the drawings, identical or substantially equivalent components may be assigned the same reference numerals. Further, in the following description of various embodiments, repeated descriptions of the identical or corresponding components may be omitted, which, however, does not mean that the corresponding components are not included in those embodiments.

Figure 1:
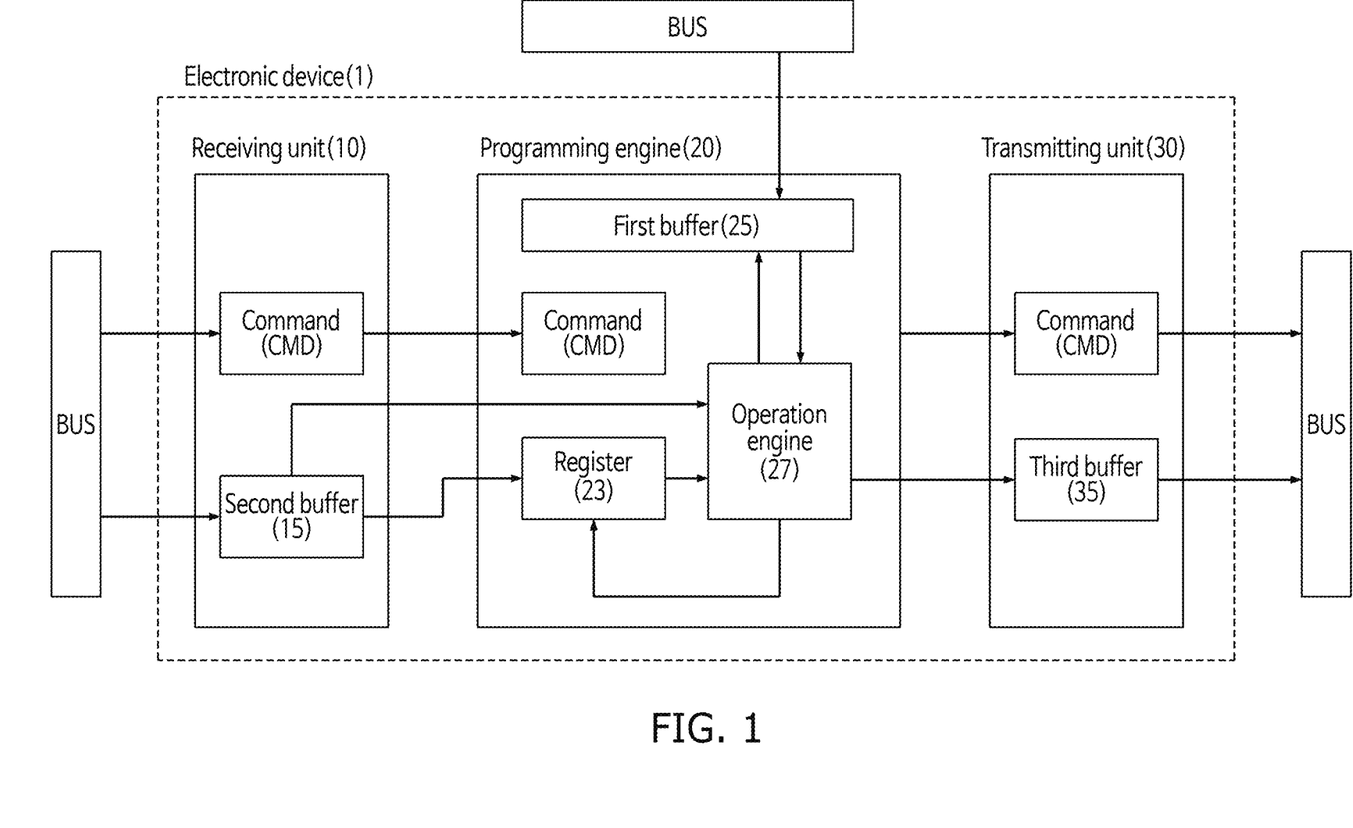
FIG. 1 is a block diagram conceptually illustrating an architecture included in an electronic device according to an embodiment of the present disclosure.

FIG. 1 is a block diagram conceptually illustrating an architecture included in an electronic device according to an embodiment of the present disclosure.

Referring to FIG. 1, an electronic device 1 according to an embodiment of the present disclosure may include a receiving unit 10 for receiving a command CMD from an external source through a bus, one or more programming engines 20 for performing an operation in response to the command CMD, and a transmitting unit 30 for transmitting a result data value of the operation performed by the one or more programming engines 20 to the outside through the bus. The electronic device according to the present disclosure is a component (for example, a system on chip (SoC), an embedded system, a memory device, and the like) including an architecture having the receiving unit 10, the one or more programming engines 20, and the transmitting unit 30, and such a component may be installable on a computing device (for example, a personal computer, a smartphone, a tablet, a laptop, and the like), but the form thereof is not particularly limited.

Referring to FIG. 1, the receiving unit 10 of the electronic device 1 may receive a command CMD from a component outside the electronic device 1, such as a core, through a system bus. The core is a logic circuit for processing instructions of a computing system and may be used in the same meaning as a processor, and the core may be, for example, one or more central processing units (CPUs). However, the command CMD may be received from a component other than the core, and the present disclosure is not limited thereto. The command CMD may be received by the receiving unit 10 of the electronic device 1 through a system bus. The system bus refers to a standardized path that can transmit and receive data between a core and a memory device, or between a core and an input/output port, and may be, for example, a data bus. In the present disclosure, data may be transmitted and received between a core and the electronic device 1, between the electronic device 1 and an external storage device (not shown), and the like through the system bus.

According to an embodiment, the receiving unit 10 is configured in the form of a queue and may process commands sequentially (for example, in a FIFO manner). Such a command may be an instruction to perform an operation based on a predetermined calculation formula for specific data. According to an embodiment, the predetermined calculation formula at this time is used in the process of solving a complex problem to be solved in dynamic programming (DP), and may be, for example, a calculation formula based on the Smith-Waterman algorithm and the like. However, the predetermined calculation formula according to the present disclosure refers to a calculation formula that is solved repeatedly, and may be associated with an algorithm other than a dynamic programming algorithm, and the present disclosure is not limited thereto.

According to an embodiment, the receiving unit 10 may include a second buffer 15 for receiving a second data value from a memory device outside the electronic device 1 through a bus. The second data value may correspond to data that is not stored in the first buffer 25 and is necessary when the programming engine 20 performs an operation based on a predetermined calculation formula in response to a command CMD from the core. The second data value may be at least one of a second result data value previously transmitted and stored externally by the electronic device 1, and a reference data value to be used for the operation. However, the value of the second data value may vary depending on the design of the electronic device 1, and various modified examples are possible.

According to an embodiment, one or more programming engines 20 may include a first buffer 25 for storing a first data value, an operation engine 27 for loading the first data value from the first buffer 25 in response to a command received from the receiving unit 10 and performing an operation based on a predetermined calculation formula on the loaded first data value, and a register 23 for storing a result data value calculated immediately before by the operation engine 27 or the data value loaded from the second buffer 15. As described above, although only one programming engine 20 is illustrated in FIG. 1 for convenience of explanation, in an actual design, a plurality of programming engines 20 may be provided, and in this case, one operation engine 27 is also provided for each program engine 20.

According to an embodiment, the first data value stored in the first buffer 25 may correspond to at least one of the first result data value obtained by performing an operation based on a predetermined calculation formula by the operation engine 27 in the past or a query data value to be used in the operation. According to an embodiment, the first data value stored in the first buffer 25 may be a query data value at the start of each operation and may be updated to the first result data value obtained for each cycle during the operation process. However, the present disclosure is not limited thereto.

In addition, according to an embodiment, when the operation engine 27 requires a second data value in addition to the first data value in order to perform an operation based on a predetermined calculation formula, the operation engine 27 may load the second data value from the second buffer 15 and perform the operation. In addition, the operation engine 27 may load and obtain the smallest unit of an immediately preceding result data value obtained from the operation from the register 23 if needed, and an immediately preceding second result data value obtained from the operation from the second buffer 15 if needed.

According to an embodiment, the register 23 included in the programming engine 20 may serve to store the smallest unit of the result data value required for the operation based on a predetermined calculation formula. This smallest unit of the result data value may basically be obtained from the immediately preceding operation result of the operation engine 27. However, in a case where the smallest unit of the result data value obtained by the immediately preceding operation does not exist, such as at the start of each row-wise operation in a matrix operation such as the Smith-Waterman algorithm, the corresponding smallest unit of data value may be obtained by loading it from the second buffer 15. Meanwhile, the smallest unit of the result data value stored in the register 23 may literally be obtained by the smallest unit of operation in the operation based on the predetermined calculation formula. This will be described in detail later with reference to FIGS. 2A to 2E.

In addition, according to an embodiment of the present disclosure, the programming engine 20 may be configured so that some of the first result data value and the second result data value obtained by performing an operation based on a predetermined calculation formula on the first data value and/or the second data value is stored in an external memory device. As a non-limiting example, the first result data value and the second result data value stored in the external memory device may be the result data value obtained last in each unit operation (for example, row-wise operation or column-wise operation), but the present disclosure is not limited thereto. That is, according to an embodiment, the capacity of the first buffer 25 and the second buffer 15 is limited, and not all the result data values may be stored for reuse, and therefore, only some of the result data values are stored in the external memory device and then called and loaded through the second buffer 15 when necessary. Therefore, the number of times data is written (stored) and read (loaded) from the external memory device located outside the electronic device 1 is reduced and the workload for data inputs/outputs of the core is also reduced.

According to an embodiment, the process of storing the result data value in the external memory device may include temporarily storing the first result data value and/or the second result data value in the third buffer 35, which is a write buffer included in the transmitting unit 30, and sequentially transmitting the same from the third buffer 35 to the external memory device.

Meanwhile, as described above, the second buffer 15 functions to obtain the required data value from the external memory device. To this end, according to an embodiment, the programming engine 20 may transmit a data request to the external memory device, and in response thereto, the receiving unit 10 may receive a second data value corresponding to the data request and store the same in the second buffer 15. Alternatively, according to another embodiment of the present disclosure, even if the programming engine 20 does not transmit a separate data request to the external memory device, the second data value may be periodically received in the second buffer 15. For example, if an operation based on a predetermined calculation formula has a specific pattern, it may be designed in advance such that specific data is received from the external memory device based on this pattern.

As a non-limiting example, the first buffer 25 and the second buffer 15 may be configured as a static random access memory (SRAM). However, at least one of the first buffer 25 and the second buffer 15 may be configured as a flip-flop or other component depending on the design, and the present disclosure is not limited thereto.

As described above, dynamic programming algorithms such as the Smith-Waterman algorithm and the Needleman-Wunsch algorithm are used for operations such as DNA sequence alignment and protein classification. However, according to the conventional method, each time an operation is performed on each data value, the previously calculated result data value must be loaded, operated, and then stored again. Therefore, if the data input/output and operations must be processed simultaneously every time the operation is performed in the core, a considerable workload is imposed. In contrast, in the case of the electronic device 1 according to an embodiment of the present disclosure, since the result data value previously obtained based on the same predetermined calculation formula may be loaded through the internal pipeline via the first buffer 25 and the second buffer 15, the workload for data inputs/outputs and operations that the core had in the past may be significantly alleviated.

FIGS. 2A to 2E are schematic diagrams showing examples of a method of performing operations using the electronic device according to an embodiment of the present disclosure.

Figure 2A:
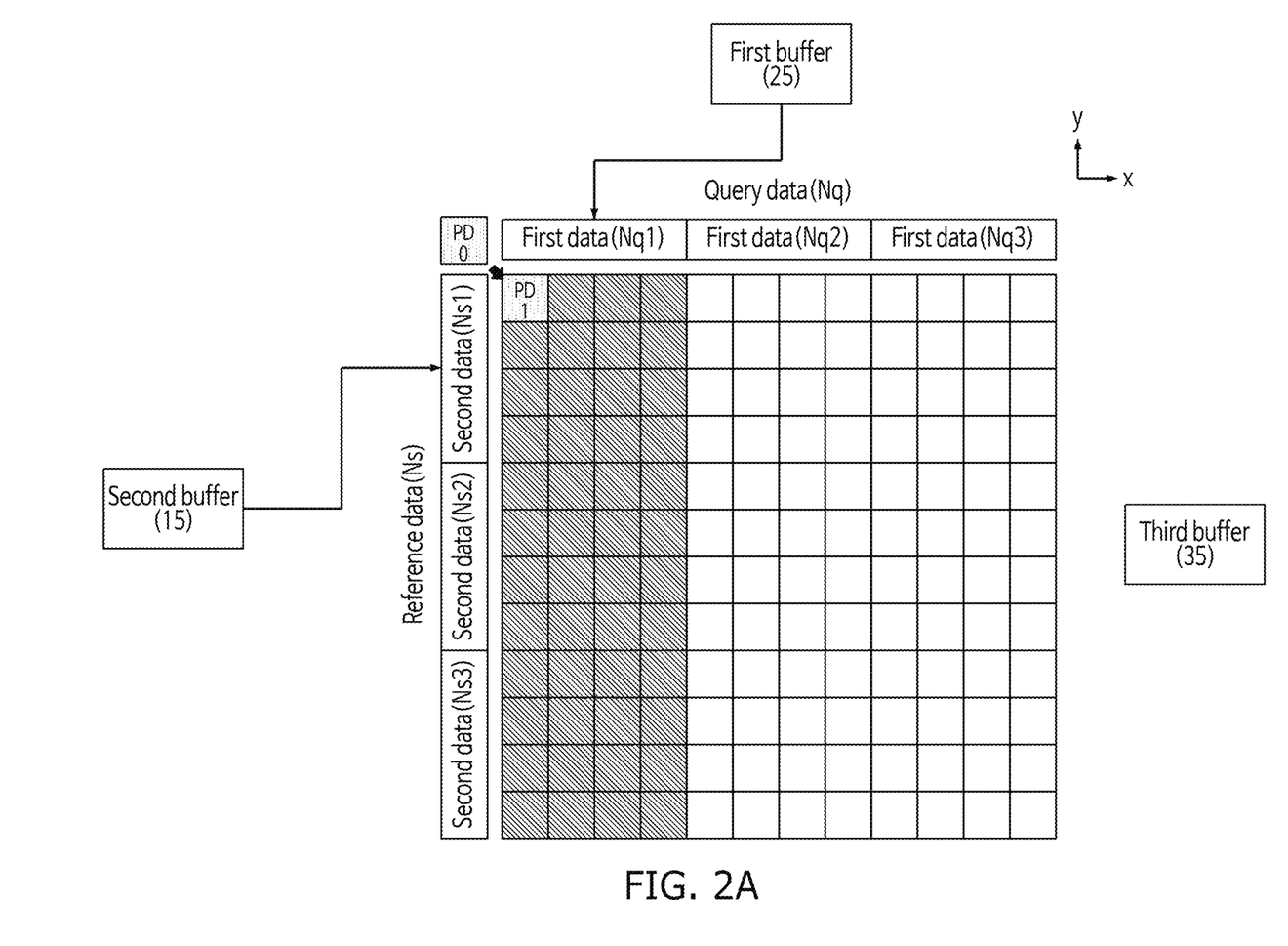
FIGS. 2A to 2E are schematic diagrams showing examples of a method of performing operations using the electronic device according to an embodiment of the present disclosure.

First, referring to FIG. 2A, when a dynamic programming algorithm such as the Smith-Waterman algorithm or the Needleman-Wunsch algorithm is used for operations such as DNA sequence alignment and protein classification, the dynamic programming algorithm performs an operation to compare query data Nq with reference data Ns and scores the comparison result to determine the optimal matching target. FIGS. 2A to 2E illustrate possible examples of performing such operations, in which the first data values Nq1, Nq2, and Nq3 loaded from the first buffer 25 may become query data Nq, and the second data values Ns1, Ns2, and Ns3 loaded from the second buffer 15 may become reference data Ns.

At this time, since the capacity of the first buffer 25 is limited, the query data Nq may be divided into a plurality of first data values Nq1, Nq2, and Nq3. In addition, since the capacity of the second buffer 15 is also limited, the reference data Ns may be divided into a plurality of second data values Ns1, Ns2, and Ns3. In the example of FIG. 2A, the query data and the reference data are each divided into three data values, but this is only exemplary.

In the example of FIG. 2A, the x-axis and the y-axis are each composed of twelve smallest units of data values. The first smallest unit of the result data value PD1 may be generated by the smallest unit of operation based on a predetermined calculation formula on the first data Nq1 loaded from the first buffer 25 and the second data Ns1 loaded from the second buffer 15. At this time, if the smallest unit of the result data value PD0 stored in advance in the register 23 is required for the operation in addition to the first data Nq1 and the second data Ns1, the operation engine 27 may refer to this value PD0 from the register 23.

Figure 2B:
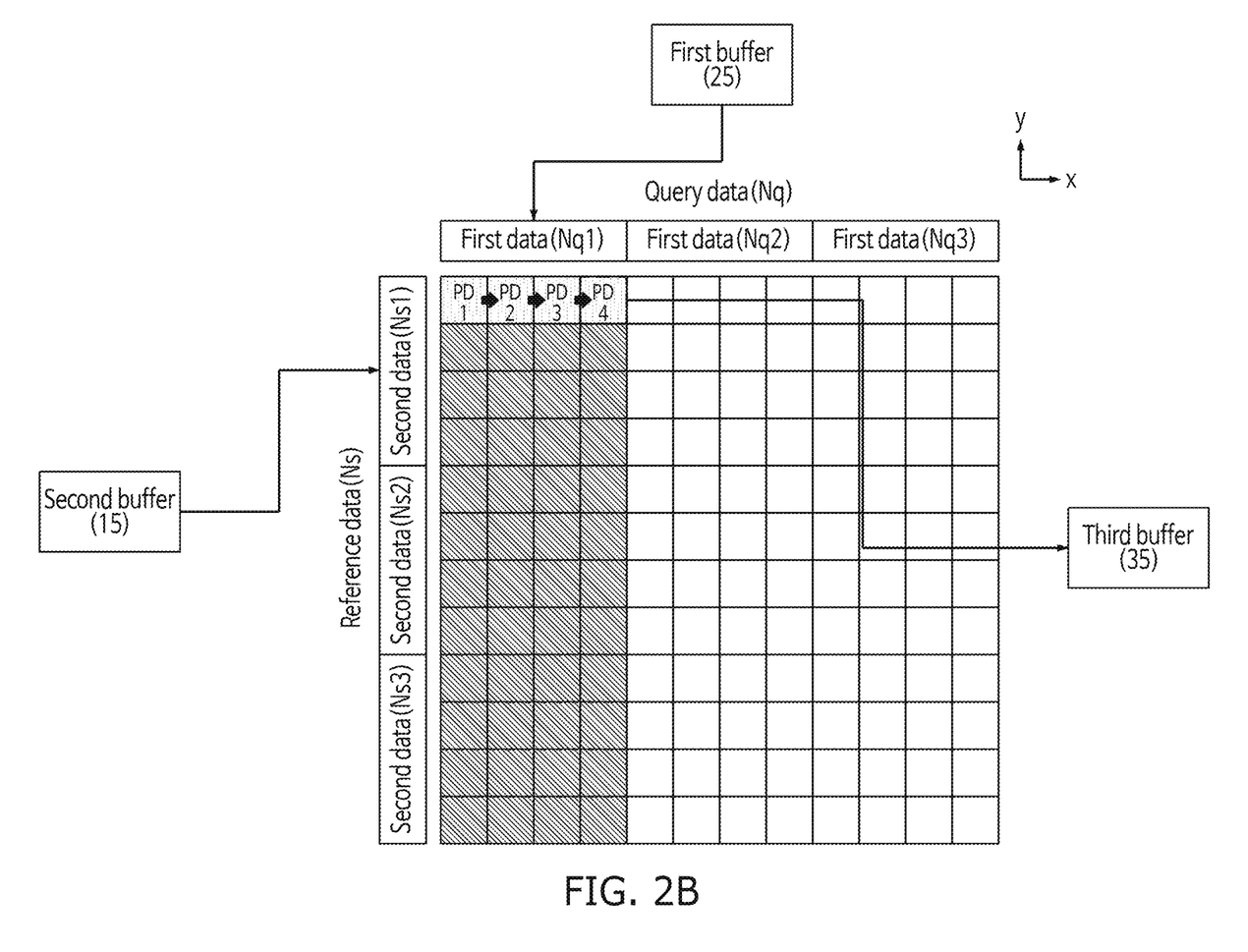

Referring to FIG. 2B, the smallest unit of operation based on a predetermined calculation formula may be performed in the x-axis direction in units of rows, and accordingly, the smallest units of the result data values PD1, PD2, PD3, and PD4 corresponding to the first data value Nq1 may be generated. At this time, the last smallest unit of the result data value PD4 of the row-wise operation may be stored in the third buffer 35.

Figure 2C:
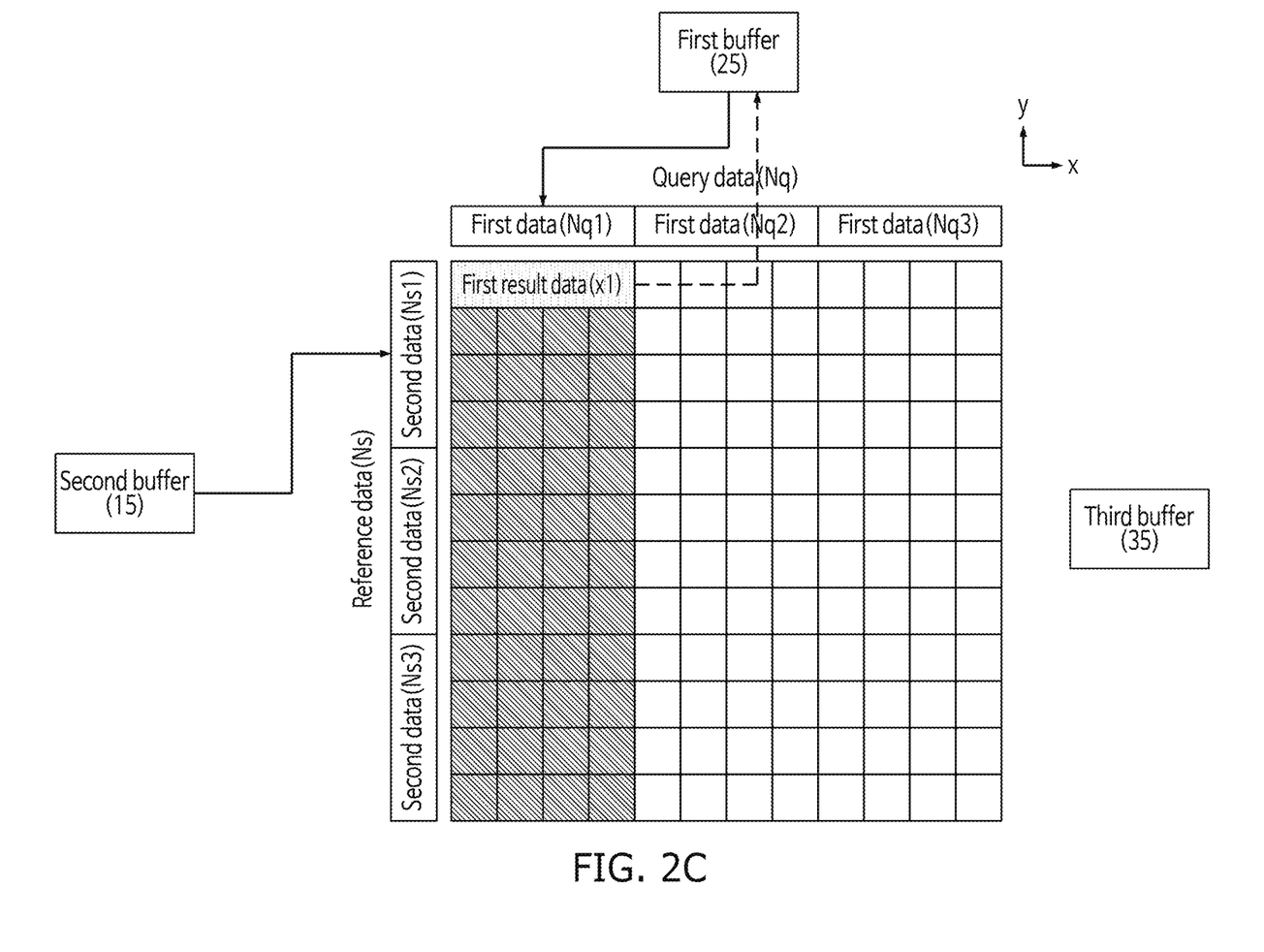

Referring to FIG. 2C, the set of smallest units of the result data values PD1, PD2, PD3, and PD4 of the row-wise operation performed in FIG. 2B may be the first result data value x1 which is the row-wise operation result for the first data value Nq1, and this first result data value x1 may be stored in the first buffer 25 to replace the existing first data Nq1.

Figure 2D:
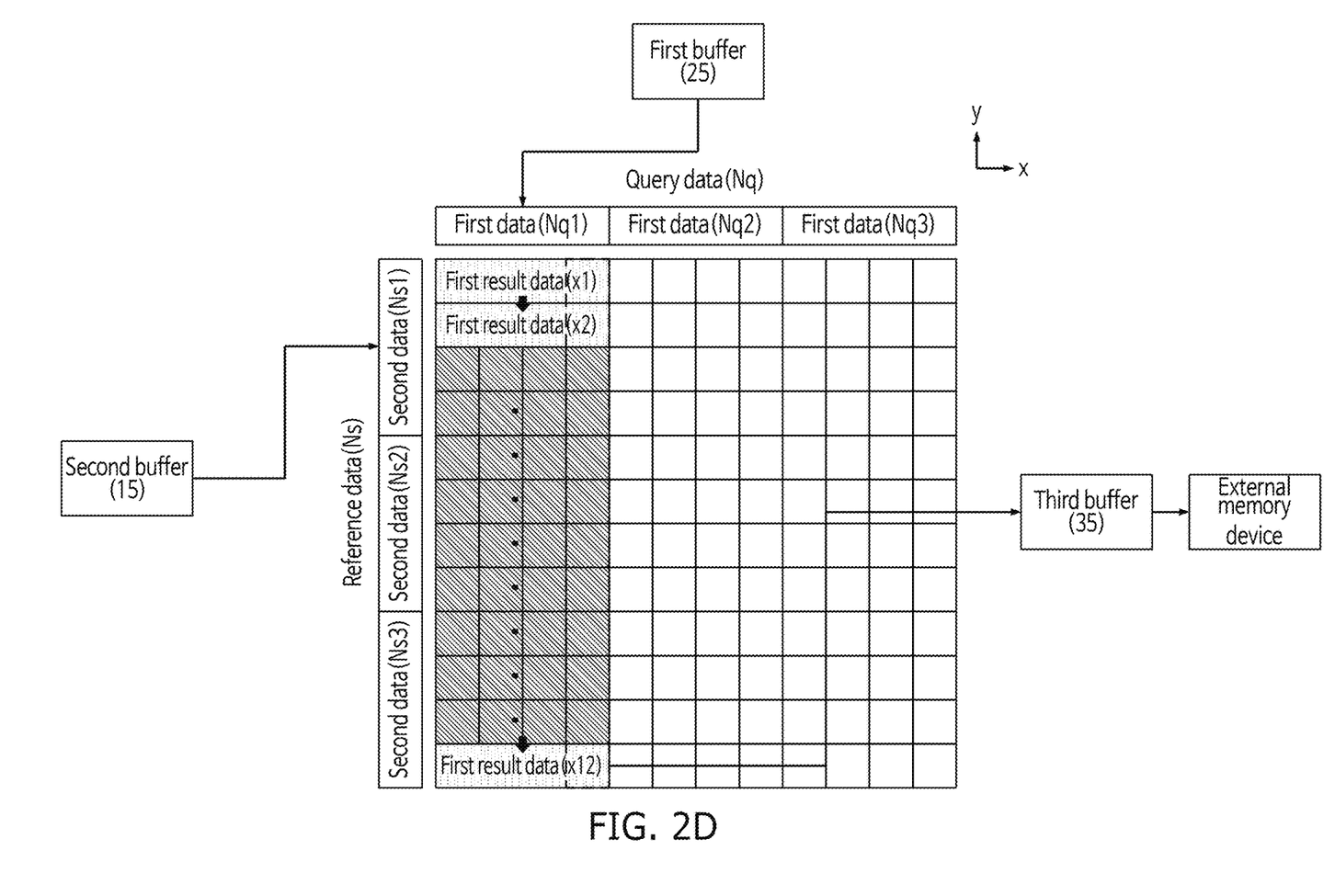

Referring to FIG. 2D, the process of generating the first result data value in FIG. 2C may be repeated, and the first result data values x1, x2, . . . , and x12 which are the row-wise operation results may be sequentially generated for each row. In this process, the last smallest unit of the result data value among the first result data values for each row may be stored in the third buffer 35 as shown in FIG. 2B, and may be sequentially transmitted to an external memory device by the third buffer 35 through a queue.

Figure 2E:
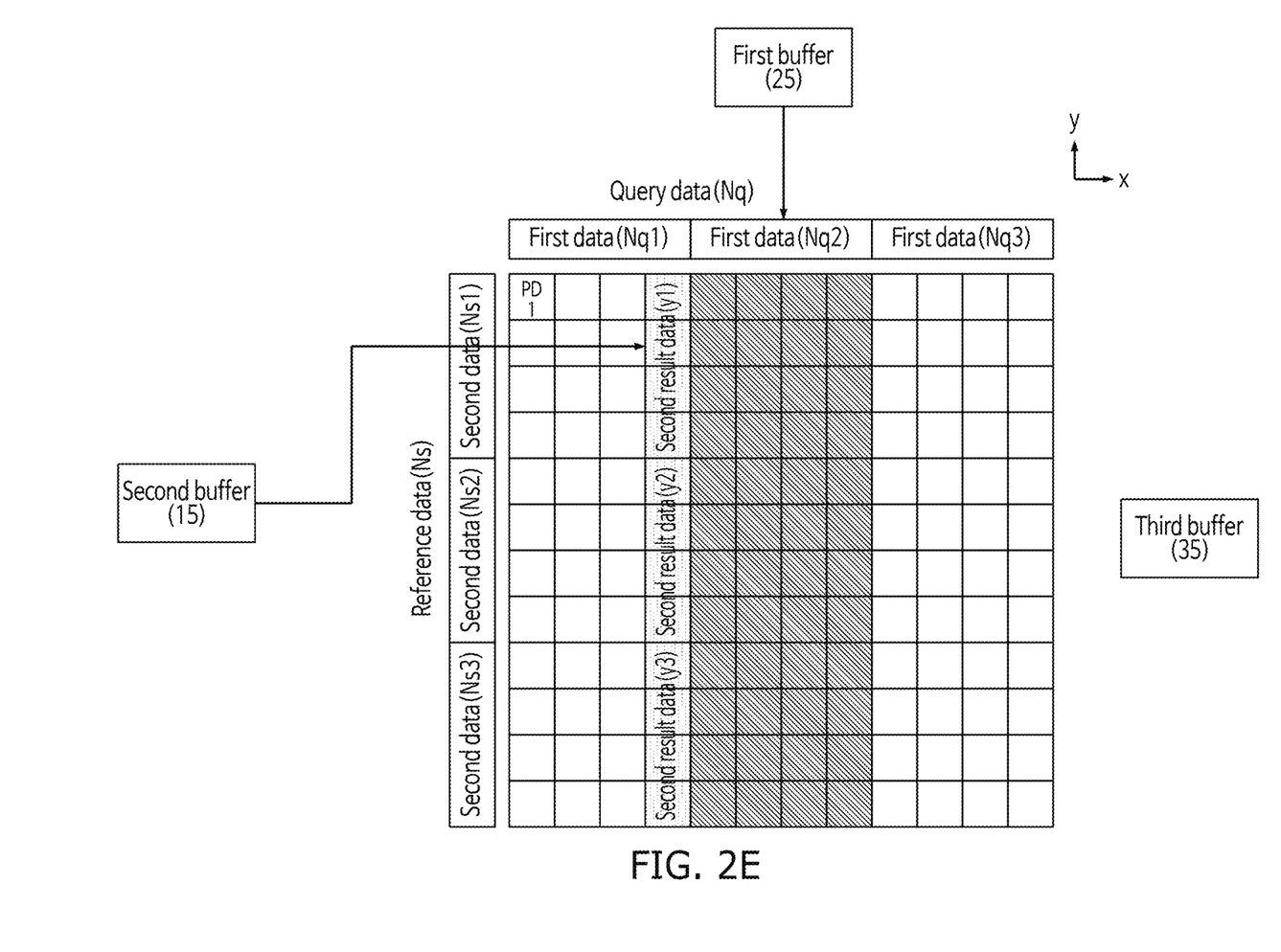

Referring to FIG. 2E, when all row-wise operations on the first data Nq1 divided from the query data Nq are completed, the operation engine 27 may load the first data Nq2 to be subjected to a subsequent operation from the first buffer 25. Then, the operation engine 27 may load the second result data y1 from the second buffer 15. The second result data y1 may be transmitted from the external memory device to the second buffer 15 and stored before performing the operation. The row-wise operation (and the smallest unit of operation) based on a predetermined calculation formula as described in FIGS. 2A to 2D may be performed.

According to an embodiment, ultimately, the operations as described in FIGS. 2A to 2E may be performed on the entire query data Nq and reference data Ns. However, the method of performing the operations using an electronic device as described above with respect to FIG. 2A to 2E is exemplary. It will be obvious to those skilled in the art that various modified examples can be derived by utilizing the fact that repetitive operations are performed utilizing data values stored in one or more buffers provided in the electronic device itself based on a command received from the core.

Figure 3:
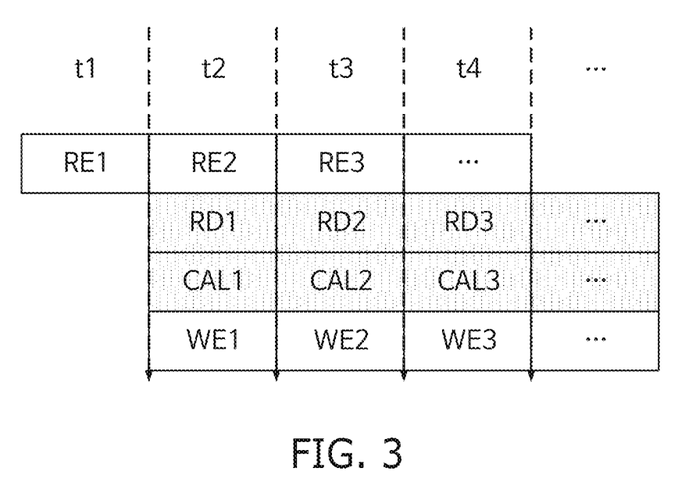
FIG. 3 is a diagram schematically showing the timing of each operation when performing an operation using the electronic device according to an embodiment of the present disclosure.

FIG. 3 is a diagram schematically showing the timing of each operation when performing an operation using the electronic device according to an embodiment of the present disclosure.

Referring to FIG. 3, when the first buffer 25 (and the second buffer 15) is an SRAM, a delay time (for example, one cycle delay) may occur in reading and loading a data value from the SRAM. Therefore, considering the characteristics of the SRAM, the programming engine may load the data value from the first buffer 25 (and the second buffer 15) in advance before performing the operation, considering the delay time.

As a non-limiting example, in the example of FIG. 3, the programming engine 20 may perform a request RE1 to load the first data value from the first buffer 25 in response to a command in the first time cycle t1. After that, the actual first data value may be loaded and read by the operation engine 27 in the second time cycle t2, which is the time cycle following the first time cycle t1, and the operation CAL1 using the loaded first data value may also be performed in the second time cycle t2. In addition, a write request WE1 for the third data value obtained as a result of the operation may also be performed in the second time cycle t2. Then, the reading RE2 and RE3, operations CAL2 and CAL3, and writing WE2 and WE3 of the first data value may also be performed according to the same operation timing.

In this way, according to an embodiment of the present disclosure, the programming engine 20 may load data values from the first buffer 25 (and the second buffer 15) in response to a command prior to performing an operation using the data values, for example, prior to the first time cycle, and the first time cycle may correspond to a delay time required to load the data values from the first buffer or may correspond to a time longer than that.

In this way, by constructing an operation pipeline of an electronic device to load data values in advance while considering the delay time required to load data values required for an operation from a buffer, a remarkable effect of minimizing the impact due to the loading delay of the data values is obtained.

Figure 4:
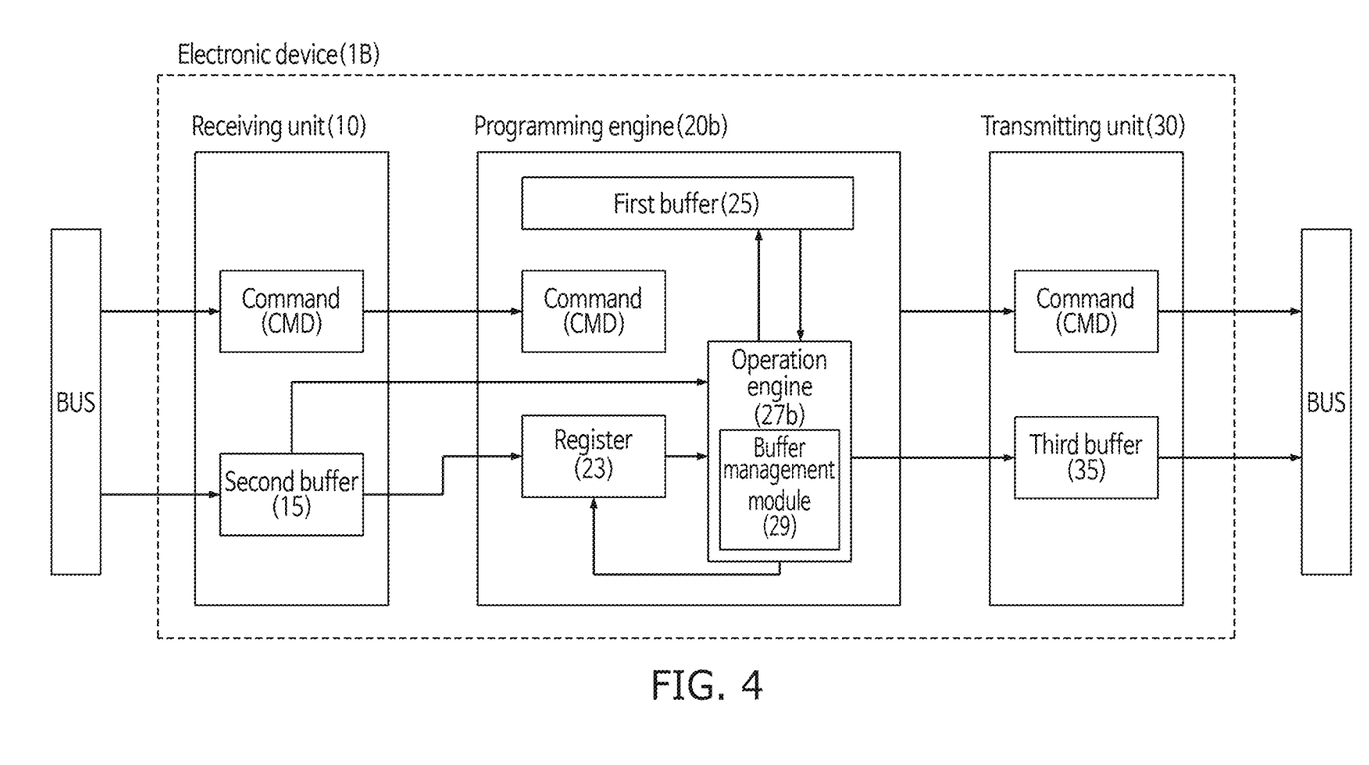
FIG. 4 is a block diagram conceptually illustrating an architecture included in an electronic device according to another embodiment of the present disclosure.

FIG. 4 is a block diagram conceptually illustrating an architecture included in an electronic device according to another embodiment of the present disclosure.

Referring to FIG. 4, an electronic device 1B according to an embodiment of the present disclosure may include, similar to the electronic device 1 of FIG. 1, a receiving unit 10 for receiving a command CMD from an external source through a bus, a programming engine 20b for performing an operation in response to the command CMD, and a transmitting unit 30 for transmitting a result data value of the operation performed by the programming engine 20 to the outside through a bus.

The electronic device 1B in FIG. 4 differs from the electronic device 1 in FIG. 1 in terms of the configuration of an operation engine 27b of the programming engine 20b. The other parts are the same, so a duplicate description will be omitted.

According to the embodiment of FIG. 4, the operation engine 27b of the programming engine 20b may include a buffer management module 29. The buffer management module 29 may determine the size and number of data values to be loaded from at least one of the first buffer 25 and the second buffer 15, respectively, in order to optimize the operation based on a predetermined calculation formula. To this end, the buffer management module 29 may consider factors such as the size of each buffer, the complexity and pattern of the predetermined calculation formula, the generation frequency and size of the data values to be stored in the buffer, and the size of the external memory device.

Specifically, referring again to the examples of FIGS. 2A to 2E, since the capacity of the first buffer 25 is limited as described above, the query data Nq may be divided into a plurality of pieces of first data Nq1, Nq2, and Nq3. According to an embodiment, such division may be performed by the buffer management module 29 of the operation engine 27. The buffer management module 29 may determine how many pieces of first data to divide the query data into by considering at least one of the capacity of the first buffer 25, the frequency and size of the first data and the first result data to be generated in the operation process, the complexity and pattern of a predetermined calculation formula, and the size of the external memory device. In addition, since the capacity of the second buffer 15 is also limited, the reference data Ns may be divided into a plurality of pieces of second data Ns1, Ns2, and Ns3, and this division may be optimized and performed by the buffer management module 29 by considering at least one of the capacity of the second buffer 15, the frequency and size of the second data required for each operation, the complexity and pattern of a predetermined calculation formula, and the size of the external memory device.

Meanwhile, according to another embodiment of the present disclosure, the buffer management module 29 may use an artificial neural network module to determine the optimized size and number of data values to be loaded from at least one of the first buffer 25 and the second buffer 15, respectively. The artificial neural network module may be trained to determine the optimal size and number of data values of each buffer in the operation of various calculation formulas through learning using a large amount of pre-learned data. The artificial neural network module may include at least one of artificial neural network modules such as a Transformer, a Long-Short Term Memory (LSTM), a Recurrent Neural Network (RNN), a Convolution Neural Network (CNN), a Generative Adversarial Network (GAN), and an AutoEncoder (AE), or may use a machine learning model such as a multi-layer perceptron, a Naive-Bayesian Classification, or a Random Forest Classification. Since various modifications are possible for specific applications of the artificial neural network module, the detailed description will be omitted.

Figure 5:
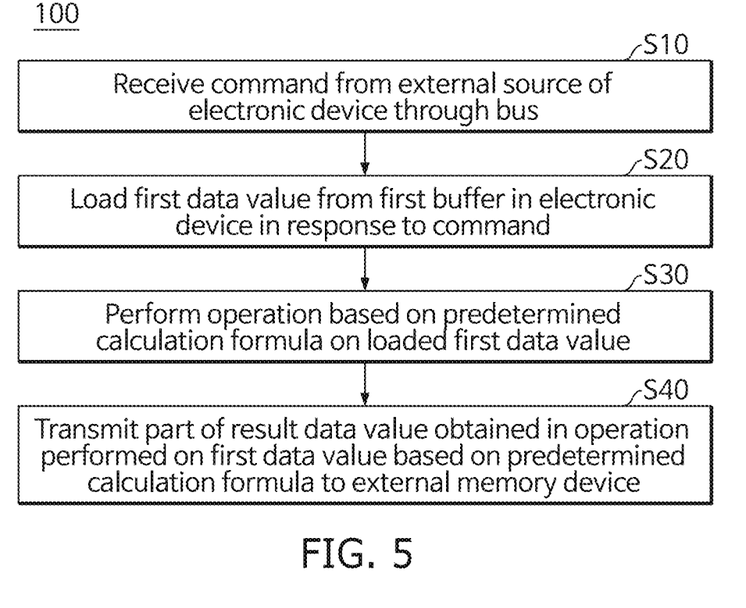
FIG. 5 is a flowchart of an operation method using the electronic device according to an embodiment of the present disclosure.

FIG. 5 is a flowchart of an operation method using the electronic device according to an embodiment of the present disclosure.

Referring to FIG. 5, a method 100 for performing operations using the electronic device according to exemplary embodiments of the present disclosure is exemplified.

First, in step S10, a command may be received from an external source of the electronic device through a bus. The command at this time may be received from a core. This command may be an instruction to perform an operation based on a predetermined calculation formula for specific data. According to an embodiment, the predetermined calculation formula at this time is used in the process of solving a complex problem to be solved in dynamic programming (DP), and may be, for example, a calculation formula based on the Smith-Waterman algorithm.

In step S20, a first data value may be loaded from a first buffer in the electronic device in response to the command received in step S10. The first data value at this time may correspond to at least one of a first result data value obtained by performing an operation based on a predetermined calculation formula by the operation engine 27 in the past or a query data value to be used for the operation.

In addition, a process of determining the optimized size and number of first data values to be loaded into the first buffer may be performed in advance. Since this process has been described above with respect to FIG. 4, a duplicate description will be omitted.

Meanwhile, in a case where the first buffer is an SRAM, a delay time (that is, a delay of the first time cycle) may occur in reading and loading the first data value from the SRAM. Therefore, considering the characteristics of the SRAM, the first data value may be loaded in advance from the first buffer considering the delay time. At this time, the first time cycle may be equal to or longer than the delay time required to load data from the first buffer.

In step S30, an operation based on a predetermined calculation formula may be performed on the loaded first data value.

In addition, if necessary, if the second data value required for the operation is received from an external memory device outside the electronic device and stored in the second buffer 15, the second data value may be obtained by loading it from the second buffer 15, and in this case, the operation based on the predetermined calculation formula may be performed on the first data value and the second data value. In addition, the data value required for the operation (that is, the second data value) may be secured by transmitting a request for the data value to be received by the second buffer to at least one of the external memory device or the core.

In step S40, some of the result data values obtained from the operation based on a predetermined calculation formula for the first data value may be transmitted to an external memory device and stored in the external memory device. The result data values stored in the external memory device may be loaded into the second buffer 15 and used for operation when necessary.

The methods according to the present disclosure may be computer-implemented methods. Although each step of the corresponding methods has been shown and described in a predetermined order in the present disclosure, the respective steps may also be performed in an order that can be combined arbitrarily according to the present disclosure, in addition to being performed sequentially. In an embodiment, at least some of the steps may be performed in parallel, iteratively, or heuristically. The present disclosure does not exclude making changes or modifications to the corresponding methods. In an embodiment, at least some steps may be omitted or other steps may be added.

Various embodiments of the present disclosure may be implemented as software recorded in a machine-readable recording medium. The software may be software for implementing the above-mentioned various embodiments of the present disclosure. The software may be inferred from various embodiments of the present disclosure by programmers in a technical field to which the present disclosure belongs. For example, the software may be a machine-readable command (for example, code or a code segment) or program. A machine may be a device capable of operating according to an instruction called from the recording medium, and may be, for example, a computer. In an embodiment, the machine may be the electronic device including the hardware architecture 100 according to embodiments of the present disclosure. In an embodiment, a processor of the machine may execute a called command to cause elements of the machine to perform a function corresponding to the command. The recording medium may refer to any type of recording medium which stores data capable of being read by the machine. The recording medium may include, for example, a ROM, a RAM, a CD-ROM, a magnetic tape, a floppy disk, an optical data storage device, and the like. In an embodiment, the recording medium may be implemented in a form in which the recording medium may be distributed to computer systems which are connected to each other through a network. The software may be distributed, stored, and executed in the computer systems. The recording medium may be a non-transitory recording medium. The non-transitory recording medium refers to a tangible medium that exists irrespective of whether data is stored semi-permanently or temporarily, and does not include a transitorily transmitted signal.

Although the technical idea of the present disclosure has been described by various embodiments, the technical idea of the present disclosure includes various substitutions, modifications, and changes that can be made within the scope that can be understood by those skilled in the art to which the present disclosure pertains. Further, it should be understood that such substitutions, modifications, and changes may fall within the scope of the appended claims. The embodiments according to the present disclosure may be combined with each other. The respective embodiments can be combined in various ways depending on the number of cases, and embodiment made in combinations also falls within the scope of the present disclosure.

What is claimed is:

1. An electronic device comprising:
a receiving unit for receiving a command from an external source;
a first buffer for storing a first data value;
a second buffer for storing a second data value;
an operation engine for loading the first data value from the first buffer and loading the second data value from the second buffer in response to the command, and performing an operation based on a predetermined calculation formula on the loaded first data value and second data value to generate a result data value;
a transmitting unit including a third buffer for receiving a part of the result data value from the operation engine, temporarily storing the same, and sequentially transmitting the same to an external memory device; and
a register for storing a smallest unit of an immediately preceding result data value obtained by the operation, wherein
the operation engine uses the smallest unit of the immediately preceding result data value to perform the operation based on the predetermined calculation formula,
the first data value is at least one of a result data value obtained by the operation engine previously performing an operation based on the predetermined calculation formula or a query data value to be used for an operation based on the predetermined calculation formula,
the second data value includes a data value obtained by transmitting to the external memory device a request for a data value to be received by the second buffer as the part of the result data values stored in the external memory device, and
the loading of the first data value from the first buffer and the loading of the second data value from the second buffer in response to the command is performed a first time cycle before performing the operation using the first data value and the second data value, and the first time cycle is equal to or longer than a delay time required to load data from the first buffer and the second buffer.

2. The electronic device as claimed in claim 1, wherein the first buffer and the second buffer are SRAMs.

3. The electronic device as claimed in claim 1, wherein the predetermined calculation formula is a calculation formula based on the Smith-Waterman algorithm.

4. The electronic device as claimed in claim 1, wherein the operation engine further includes a buffer management module, and
the buffer management module determines the size and number of first data values to be loaded into the first buffer.

5. A method for performing an operation using an electronic device, the method comprising:
receiving a command from an external source of the electronic device;
loading a first data value from a first buffer within the electronic device and loading a second data value from a second buffer within the electronic device in response to the command;
performing an operation based on a predetermined calculation formula on the loaded first data value and second data value to generate a result data value, the first data value being at least one of a result data value obtained by previously performing an operation based on the same predetermined calculation formula or a query data value to be used for an operation based on the predetermined calculation formula;
temporarily storing a part of the result data value in a third buffer within the electronic device, the part of the result data value temporarily stored in the third buffer being sequentially transmitted to an external memory device; and
storing a smallest unit of an immediately preceding result data value obtained by the operation, wherein
performing the operation includes using the smallest unit of the immediately preceding result data value to perform the operation based on the predetermined calculation formula,
the second data value includes a data value obtained by transmitting to the external memory device a request for a data value to be received by the second buffer as the part of the result data values stored in the external memory device, and
the loading of the first data value from the first buffer and the loading of the second data value from the second buffer in response to the command is performed a first time cycle before performing the operation using the first data value and the second data value, and the first time cycle is equal to or longer than a delay time required to load data from the first buffer and the second buffer.

6. The method as claimed in claim 5, wherein the first buffer and the second buffer are SRAMs.

7. The method as claimed in claim 5, further comprising: determining the size and number of first data values to be loaded into the first buffer.

* * * * *